(12) United States Patent
Higuchi et al.

(10) Patent No.: US 6,635,399 B2
(45) Date of Patent: Oct. 21, 2003

(54) ONE BASE PHOTOSENSITIVE IMAGING SYSTEM

(75) Inventors: Tetsuya Higuchi, Kanagawa (JP); Takahiro Uchibori, Kanagawa (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/761,014

(22) Filed: Jan. 16, 2001

(65) Prior Publication Data

US 2002/0045121 A1 Apr. 18, 2002

(30) Foreign Application Priority Data

Aug. 10, 2000 (JP) .......................... 2000-277266

(51) Int. Cl.[7] .................................................. G03C 5/00
(52) U.S. Cl. ........................................................ 430/138
(58) Field of Search ................................ 430/138, 523, 430/531, 538, 950, 933

(56) References Cited

U.S. PATENT DOCUMENTS

| 4,333,998 A | 6/1982 | Leszyk ......................... 430/12 |
| 4,656,296 A | 4/1987 | Floyd .......................... 549/379 |
| 4,766,050 A | 8/1988 | Jerry |
| 4,906,299 A | 3/1990 | Dragner ....................... 106/214 |
| 5,783,353 A | 7/1998 | Camillus et al. ............. 430/138 |
| 5,786,127 A | 7/1998 | Madoux et al. ............ 430/273.1 |
| 5,851,951 A | 12/1998 | Yamori et al. ................ 503/216 |
| 5,916,727 A * | 6/1999 | Camillus et al. ............. 430/138 |
| 5,948,586 A * | 9/1999 | Hare ............................ 430/138 |
| 6,030,740 A | 2/2000 | Polykarpov |
| 6,040,040 A | 3/2000 | Rainbow ...................... 428/212 |
| 6,060,206 A * | 5/2000 | Hanaki et al. ............... 430/138 |
| 6,080,520 A | 6/2000 | Polykarpov et al. |
| 6,127,084 A | 10/2000 | Katampe et al. |
| 2002/0155372 A1 * | 10/2002 | Ling et al. ................... 430/138 |
| 2003/0096187 A1 * | 5/2003 | Polykarpov et al. ......... 430/138 |

FOREIGN PATENT DOCUMENTS

| DE | 3628237 | * | 8/1986 |
| EP | 0323887 | | 7/1989 |
| EP | 755929 | * | 7/1996 |
| JP | 11-119423 | | 4/1999 |
| JP | 11-119424 | | 4/1999 |
| JP | 11-237734 | * | 8/1999 |

OTHER PUBLICATIONS

Machine translation of JP 11–237734.*

* cited by examiner

*Primary Examiner*—Janet Baxter
*Assistant Examiner*—Amanda C. Walke
(74) *Attorney, Agent, or Firm*—Thompson Hine

(57) ABSTRACT

A self-contained photosensitive material comprising: a support; an imaging layer on the support, the imaging layer comprising a developer material and a plurality of photosensitive microcapsules encapsulating a photosensitive composition and a color precursor; and a protective coating on the imaging layer, the protective coating comprising a cured film of a water-soluble or water-dispersible resin, wherein upon image-wise exposing the imaging layer to actinic radiation and rupturing the microcapsules, the color precursor is released from the microcapsules and reacts with the developer material to form a color image is disclosed.

26 Claims, 1 Drawing Sheet

ONE BASE PHOTOSENSITIVE IMAGING SYSTEM

BACKGROUND OF THE INVENTION

The present invention relates to an improvement in photosensitive imaging systems of the type taught in U.S. Pat. Nos. 4,399,209 and 4,440,846, wherein the photosensitive imaging system includes a protective coating.

Imaging systems employing microencapsulated radiation sensitive compositions are the subject of commonly assigned U.S. Pat. Nos. 4,399,209; 4,416,966; 4,440,846; 4,766,050; 5,783,353; 6,030,740; 6,037,094 and 6,080,520. These imaging systems are characterized in that an imaging sheet including a layer of microcapsules containing a photohardenable composition in the internal phase is imagewise exposed to actinic radiation. In the most typical embodiments, the photohardenable composition is a photopolymerizable composition including a polyethylenically unsaturated compound and a photoinitiator and a color former is encapsulated with the photopolymerizable composition. Exposure to actinic radiation hardens the internal phase of the microcapsules. Following exposure, the imaging sheet is developed by subjecting it to a uniform rupturing force in the presence of a developer. An image transfer system in which the developer material is coated on a separate substrate as a separate developer or copy sheet is disclosed in commonly assigned U.S. Pat. No. 4,399,209. A self-contained imaging system in which the encapsulated color former and the developer material are present in one layer or in two interactive layers is disclosed in commonly assigned U.S. Pat. No. 4,440,846. Self-contained imaging systems having an opaque support are disclosed in commonly assigned U.S. Pat. No. 6,080,520. A two-sided imaging material is disclosed in commonly assigned U.S. Pat. No. 6,030,740.

U.S. Pat. No. 5,783,353, commonly assigned, discloses a self-contained imaging system wherein the imaging layer is sealed between two supports to form an integral unit. The sealed format is advantageous in that it can reduce oxygen permeation and improve stability of the media. Although the sealed format can improve media stability, some of the adhesives used between the imaging layer and the support can cause discoloration of the imaging layer.

SUMMARY OF THE INVENTION

In accordance with the present invention, a self-contained photosensitive material is provided which includes an imaging layer of photosensitive microcapsules and a developer on a support and a protective coating on the imaging layer. The protective coating, comprising a water-soluble or water-dispersible resin, provides scratch resistance and water resistance to the imaging media. The protective coating may also include a crosslinking agent.

In another embodiment of the invention, the self-contained photosensitive material includes a support, an imaging layer on the support and a protective coating on the imaging layer wherein the imaging layer comprises a layer of photosensitive microcapsules and a developer in the same or a separate layer as the microcapsules.

In a more particular embodiment of the invention, the protective coating comprises an acrylic latex and a polyaldehyde crosslinking agent.

In another embodiment of the present invention, an insolubilizer is present in at least one of the imaging layer and the protective coating. The insolubilizers as used in the present invention improve stability of the photosensitive material under various storage conditions. In particular, the insolubilizers improve humidity stability of the imaging media.

DETAILED DESCRIPTION OF THE INVENTION

Figure 1:
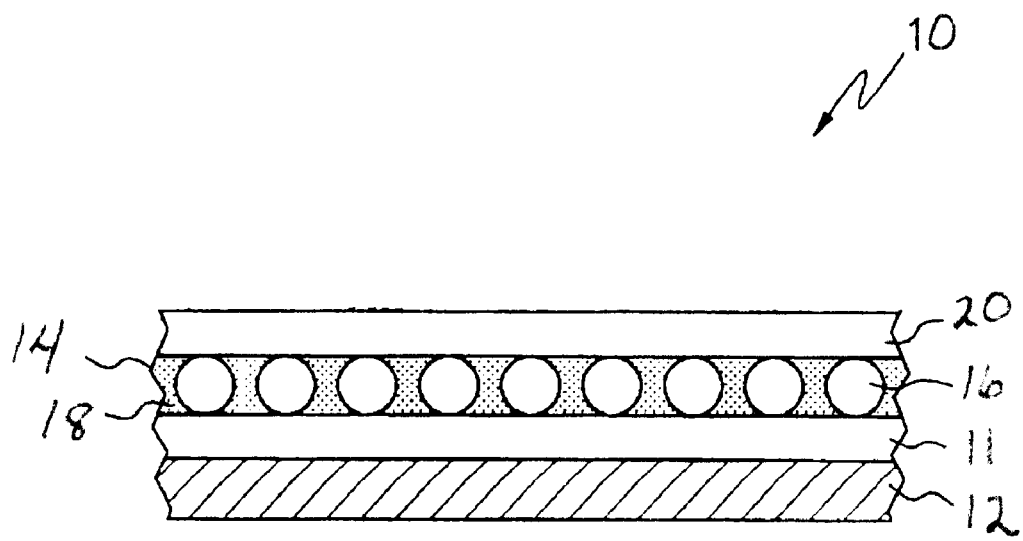
FIG. 1 is a cross-sectional view of an imaging system of the present invention.

U S. Pat. Nos. 4,399,209; 4,440,846; 5,783,353; 6,030,740; 6,037,094 and 6,080,520 are incorporated herein by reference to the extent not inconsistent with the teachings herein.

The improved imaging system of the invention may be embodied in a self-contained copy sheet in which the photosensitive microcapsules and the developer material are co-deposited in one layer or in two interactive layers as described in U.S. Pat. No. 5,783,353. The imaging system of the invention may also be embodied in a two sided self-contained system in which the microcapsules and the developer are provided in one or in individual layers as just described on opposite sides of an opaque support. Each system operates by photographic control of the access between the chromogenic material and the developer as previously described. In the self-contained imaging system, following capsule rupture, the chromogenic material and the developer are able to react to form a visible image in the unexposed areas. Gradual development of the visible image is observed following exposure and capsule rupture as the chromogenic material exudes from the microcapsules, migrates to the developer and mixes and reacts. In the most typical embodiment, capsule rupture is effected by the application of pressure to the imaging sheet using pressure rollers or a roller ball. To record images the imaging material can be scanned with an LED print head or LCD device and developed by application of pressure to the unit. The media can be imaged using a printer which incorporates an LED/developer head of the type described in U.S. Pat. 5,550,627.

In accordance with the invention, the photosensitive material includes a protective coating on the imaging layer. This coating is applied directly to the imaging layer as a solution or dispersion which is dried or cured to form a protective coating. The protective coating serves many of the same functions as the second support in a sealed self-contained imaging media as disclosed in U.S. Pat. No. 5,783,353. In particular, the protective coating provides a water resistant and scratch resistant surface to the imaging media. Furthermore, the elimination of the adhesive used with the second support in imaging media which are sealed on both sides improves the humidity stability of the image. The protective coating of one embodiment of the invention typically comprises a water-soluble or water-dispersible resin and a crosslinking agent. In a particular embodiment of the present invention, the protective coating comprises an acrylic latex and a polyaldehyde crosslinking agent such as glyoxal.

In accordance with another embodiment of the present invention, an insolubilizer is provided in at least one of the imaging layer and the protective coating. The insolubilizer further improves humidity stability of the imaging media. Although not wishing to be bound, it is the applicants' belief that the insolubilizer improves humidity stability by reacting with active groups in binder systems used in the imaging layer and the protective coating layer.

Resins which can be used in the protective coating of the present invention include those having film-forming properties. Preferably the resin used is a water-soluble resin or a latex dispersed in water. When formed into a film by drying or curing, the resin should be essentially transparent and remain transparent over a broad temperature range without clouding or yellowing. The resin film should also impart scratch resistance, water resistance, gloss and durability to the protective coating. Examples of water-soluble resins useful in the present invention include natural polymers (e.g., alginic acid compounds, cellulose derivatives, casein, gelatin, etc.), polyvinyl compounds (e.g., polyvinyl alcohol, polyvinyl alcohol which is modified by silanol, polyvinyl alcohol which is modified by carboxylic acid, etc.), polyacrylamide, polyacrylic acid, vinyl pyrrolidone-maleic acid copolymer, etc. Examples of water-dispersible resins include acrylic latex (e.g., acrylic ester, modified acrylic ester, acrylic ester copolymer, modified acrylic ester copolymer) and other polymer latices (e.g., styrene-butadiene copolymer, styrene-maleic anhydride copolymer, butadiene-methacrylate copolymer, vinylacetate-vinyl chloride-ethylene copolymer, vinylidene chloride-acrylonitrile copolymer, etc.).

In one embodiment, the binder used in the protective coating is an acrylic latex. Examples of acrylic latices, include but are not limited to, acrylic esters, modified acrylic esters, acrylic ester co-polymers, and modified acrylic ester copolymers. A particularly preferred acrylic latex is SA-532 available from Nippon Shokubai. The binder is usually used in an amount of about 50% to 90% by weight, preferably about 60% to about 80% by weight, based on the total solids content of the protective coating.

Crosslinking agents may be incorporated into the protective coating composition, depending on the types of polymer used, to ensure that the protective coating provides the desired properties, namely water resistance, scratch resistance and gloss. Examples of preferred crosslinking agents used in the protective coating include, but are not limited to, polyvalent aldehyde compounds such as glyoxal, glutaraldehyde, and derivatives of those compounds which retain free aldehyde groups. Glyoxal is the preferred polyaldehyde. Other crosslinking agents useful in the present invention include di-isocyanate compounds, epoxy compounds, bis-ethyleneimine compounds, di-vinyl compounds (e.g., divinylbenzene), methacrylic (or acrylic) ester of polyhydric alcohol (e.g., TMPTA), allylglycidyl ether, di-epoxide of polyhydric alcohol, methacrylic anhydride, N-methylolacrylamide, organic peroxide, di-amine compounds, bis-2-oxazoline compounds, polymers having 2-oxazoline group and polymer having carbodiimide group. The crosslinking agent is typically present in an amount from about 2% to 20%, preferably from about 4% to 10%, based on total solids content of the protective coating.

The protective coating layer may further include other additional components such as surfactants, UV absorbing compounds, light stabilizers, pigments, matting agents, fillers, etc. Inclusion of surfactants as wetting agents allows the aqueous coating solution to spread uniformly across the photosensitive layer's surface and produce a smooth coating. Generally, the amount of wetting agent in the coating solution should be from about 1% to about 10% by weight of the coating solution, more preferably from about 4% to about 8%. Examples of wetting agents include diakyl sulfosuccinate sodium salt and anion fluoroalkyl type surfactants. These surfactants are commercially available from Kao Corp. (PELEX OTP) and Dainippon Ink Chemicals, Inc. (Megafac F140NK), respectively.

A pigment may be added to the protective layer to improve handling and to prevent blocking. The pigment is not particularly limited, and examples of the pigment may include inorganic pigments such as calcium carbonate, zinc oxide, titanium dioxide, silicone dioxide, aluminum hydroxide, barium sulfate, zinc sulfate, talc, kaolin, clay and colloidal silica, and organic pigments such as styrene microballs, nylon powder, polyethylene powder, urea-formaldehyde resin filler and raw starch particles. Colloidal silica is the preferred pigment and is available commercially under the trade name SNOWTEX available from Nissan Chemicals.

The protective coating may also include UV absorbing compounds which can improve the light resistance and stability of the image media. Examples of UV absorbing compounds useful in the present invention include, but are not limited to salicylic acid-type UV absorbers, benzophenone-type UV absorbers, hindered amine-type UV absorbers and benzotriazole-type UV absorbers. Preferably the UV absorber is a benzotriazole compound, and, in particular, a high molecular weight benzotriazole emulsion. A specific material this type is ULS-1383 MG available from Ipposha Oil. The amount of the ultraviolet absorbing compound is not limited specifically, it is desirable to adjust the amount preferably to 5% to 30% based on total solids content of the protective coating.

It has been found that by incorporating an insolubilizer into the photosensitive image media the deleterious effects of storage under extreme humidity conditions can be avoided. Accordingly, the imaging media of the present invention when stored under high humidity conditions is less likely to be subject to the decrease in Dmax and light sensitivity which can occur with conventional media in many cases. Furthermore, the photosensitive imaging media of the present invention exhibits good low humidity stability under humidity conditions which can cause discoloration with the conventional media.

Insolubilizers useful in the present invention include those represented by the general chemical structures (I), (II) and (III):

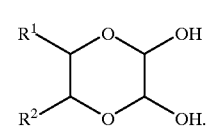

(I)

wherein $R^1$ and $R^2$ are the same or different and represent H, OH, alkyl (C1–C10), hydroxylalkyl, polyhydroxy substituted alkyl, alkyl carbonyloxy alkyl, alkenyl (C2–C10) carbonyloxy alkyl, or carbonyloxy alkyl having carboxyl, carboxyl salt or a carboxy ester group as a terminal group;

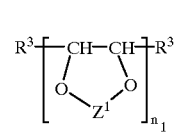

(II)

wherein $R^3$ is H, OH, alkyl (C1–C10), hydroxyalkyl, polyhydroxy substituted alkyl, alkyl carbonyloxy alkyl or alkenyl (C2–C10) carbonyloxy alkyl, $n_1=2-4$ and $Z^1$ is

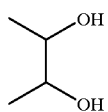

if a dioxan is formed and if a dioxan is not formed $Z^1$ represents H atoms which form a diol; and

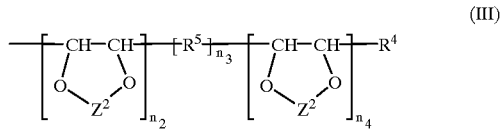

wherein $R^4$ is H, OH, alkyl (C1–C10), hydroxyalkyl, polyhydroxy substituted alkyl, alkyl carbonyloxyalkyl or alkenyl (C2–C10) carbonyloxy alkyl; $R^5$ is —CH$_2$— or —CH(OH)—; $n_2$, $n_3$, $n_4$ are each 1 or 2 and $Z^2$ is the same as $Z^1$ above.

Specific examples of insolubilizers useful in the present invention include the following compounds:

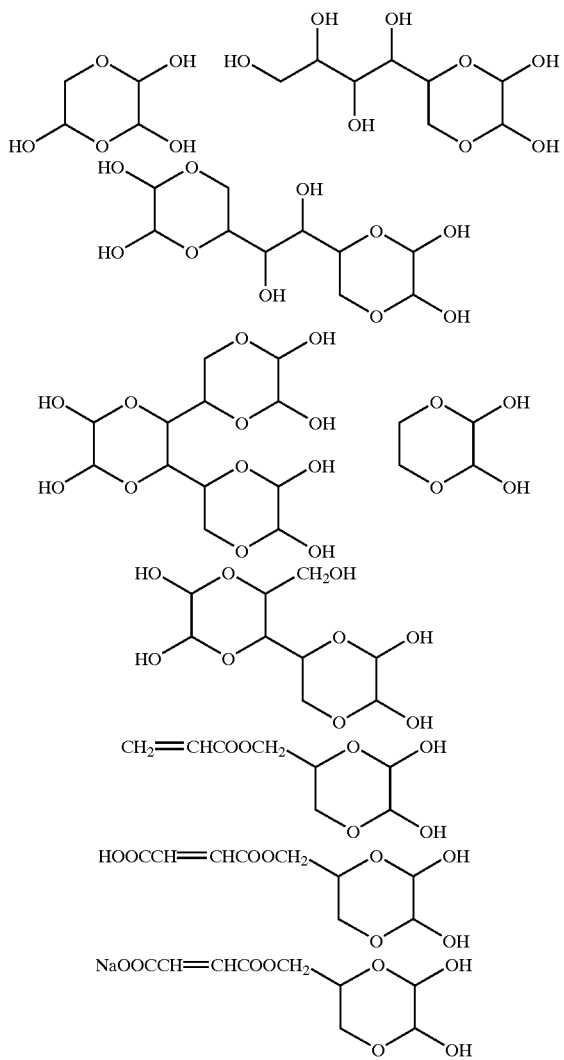

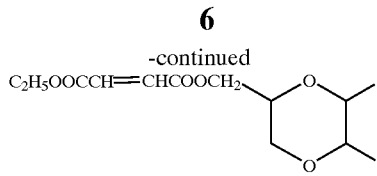

A particularly preferred insolubilizer is Sequarez 755 available from Omnova. Sequarez 755 reacts with the functional groups of the binders, thereby providing a high degree of insolubilization to the coating.

The insolubilizer can be present in either the image layer, the protective coating layer or both. When the imaging layer and/or the protective coating layer contains an insolubilizer, the insolubilizer is typically present in an amount from 0.01% to 15% and more preferably from 0.5% to 10% based on total solids content of the image and protective coatings.

A photosensitive material in accordance with one embodiment of the invention is illustrated in more detail in FIG. 1. A self-contained imaging system 10 comprises: a transparent support 12, a subbing layer 11, an imaging composition 14 comprising photohardenable microcapsules 16 and a developer material 18, and a protective coating 20. In another embodiment (not shown), the photohardenable microcapsules and developer material are provided as separate, adjacent layers in the imaging layer. Imaging layer 12 typically contains about 20 to 80% (dry weight) of the developer, about 80 to 20% (dry weight) microcapsules and 0 to 20% of a binder. The imaging layer is typically applied at a dry coat weight of about 8 to 20 g/cm$^2$.

Figure 2:
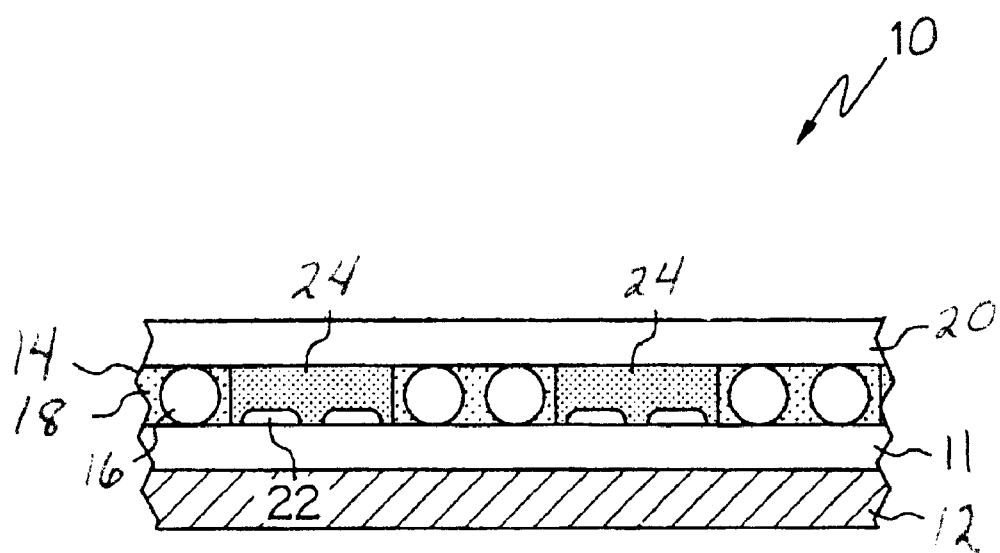
FIG. 2 is a cross-sectional view of FIG. 1 after exposure and microcapsule rupture.

Images are formed in the present invention in the same manner as described in U.S. Pat. No. 4,440,846. By imagewise exposing this unit to actinic radiation, the microcapsules are differentially hardened in the exposed areas. The exposed unit is subjected to pressure to rupture the microcapsules. FIG. 2 illustrates the self-contained imaging system of FIG. 1 after exposure and rupture of the microcapsules 16. Ruptured microcapsules 22 release a color forming agent, whereupon the developer material 18 reacts with the color forming agent to form an image 24. The image formed is viewed through the transparent protective coating against the support 12. The support 12 is preferably an opaque support such as polyethylene terephthalate (PET) containing an opacifying agent, paper or paper lined with film (polyethylene, polypropylene, polyester, etc.) Most preferably the opaque support is a polyethylene terephthalate support containing about 10% titanium dioxide which provides a bright white support. This support is commercially available from ICI, Ltd. under the product designation Melinex. Typically, the PET support has a thickness of about 2 to 4 mils, although supports having a thickness of about 4 to 10 mils may be used in accordance with the present invention to provide a more rigid imaging media.

Generally, the opaque support will be available commercially. Some other products which are useful include paper, cardboard, polyethylene, polyethylene-coated paper, etc. Opaque films are composites or admixtures of the polymer and the pigment in a single layer, films or coated papers. Alternatively, the opacifying agent can be provided in a separate layer underlying or overlying a polymer film such as PET. The opacifying agent employed in these materials is an inert, light-reflecting material which exhibits a white opaque background. Materials useful as the opacifying agent include inert, light-scattering white pigments such as titanium dioxide, magnesium carbonate or barium sulfate. In a preferred embodiment the opacifying agent is titanium dioxide.

The operational center of the imaging system of the present invention is the encapsulate or internal phase of the microcapsules. In accordance with the invention, the internal phase comprises a photosensitive composition and a chromogenic material. Typically, the photosensitive composition includes a photoinitiator and a substance which undergoes a change in viscosity upon exposure to light in the presence of the photoinitiator. That substance is most typically a monomer, dimer, or oligomer which is polymerized to a higher molecular weight compound or it may be a polymer which is cross-linked. If a negative-working imaging material is desired, it may be a compound which is depolymerized or otherwise decomposed upon exposure.

Typically, the photosensitive composition is a free radical addition polymerizable or crosslinkable composition. The most typical examples of a free radical addition polymerizable or crosslinkable composition useful in the present invention contains an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate. Other radiation curable substances as well as radiation de-polymerizable materials are described in U.S. Pat. No. 4,399,209.

The chromogenic materials used in the present invention include those chromogenic materials conventionally used in carbonless paper. In general, these materials are colorless electron donating dye precursor compounds which react with a developer compound to generate a dye. Representative examples of such dye precursors include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl) phthalide, 3-(p-dimethylaminophenyl)-3-(1, 2dimethylindole-3-yl)phthalide, 3-(p-dimethylaminophenyl)-3-(2-methylindole-3-yl)phthalide, 3-(p-dimethylaminophenyl)-3-(2-phenylindole-3-yl) phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoran, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propyl-spirodibenzoidipyran, etc. Mixtures of these dye precursors can be use if desired. Also useful in the present invention are the fluoran color formers disclosed in U.S. Pat. No. 3,920,510, which is incorporated by reference.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer, oil and other additives) containing the chromogen. A preferred range is from about 2 percent to about 8 percent. The amount of the chromogenic material required to obtain suitable images depends on the nature of the chromogen, the nature of the internal phase, and the type of imaging system. Less chromogenic material may be used in the internal phase of a self-contained imaging system in which the developer material is co-deposited on a common substrate with the microcapsules. To prevent undesired coloration in a self-contained sheet one may incorporate color suppressants with the chromogenic material.

In addition to the chromogenic material and the photosensitive material, the internal phase of microcapsules may also include a carrier oil to affect and control the tonal quality of the images obtained. Tonal quality (half-tone gradation) is an important factor in faithfully reproducing pictorial images. Initial studies show that where trimethylol propane triacrylate is used in the radiation curable material, 20% of a carrier oil such as brominated paraffin can improve tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, caster oil, mineral oil, deodorized kerosene, naphthenic mineral oils, dibutyl phthalate, dibutyl fumerate, brominated paraffin and mixtures thereof. Alkylated biphenyls are generally less toxic and preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used. Where ultraviolet sensitivity is desired, as in the case of direct transmission imaging using ultraviolet light, suitable photoinitiators include α-alkoxy phenyl ketones, O-acylated-α- oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulforyl thioxanthanone, chloromethylnaphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, chloromethyl quinoline, chlorosulfonyl quinoline, chloromethyl benzophenone, chlorosulfonyl benzophenone, chloromethyl fluorenone, chlorosulfonyl fluorenone, carbon tetrabromide, benzoin methyl ether, benzoin ethyl ether, desyl chloride, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

Particularly useful as photoinitators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. When employed as a photoinitiator in the present invention, the cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight. While the cationic dye-borate anion complex can be used alone as the initiator, it is preferable to use the complex in combination with an autoxidizer. An autoxidizer is a compound which is capable of consuming oxygen in a free radical chain process. Examples of useful autoxidizers are N,N-dialkylanilines.

Examples of N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline, 2,6-diethyl-N,N-dimethylaniline, N,N,2,4,6-pentamethylaniline (PMA) and p-t-butyl-N,N-dimethylaniline.

In accordance with one embodiment of the invention, the photohardenable compositions used in the microcapsules contain a dye borate photoinitiator and a disulfide coinitiator. Examples of useful disulfides are described in U.S. Pat. No. 5,230,982.

In accordance with one embodiment of the invention, a full color imaging system is provided in which the microcapsules are in three sets respectively containing cyan, magenta and yellow color formers respectively sensitive to red, green, and blue light respectively. For good color balance, the visible-sensitive microcapsules are sensitive (λ max) at about 450 nm, 540 nm, and 650 nm, respectively. Such a system is useful with visible light sources in direct transmission or reflection imaging. Such a material is useful in making contact prints, projected prints of color photographic slides, or in digital printing. They are also useful in electronic imaging using lasers or pencil light sources of appropriate wavelengths. Because digital imaging systems do not require the use of visible light, sensitivity can be extended into the UV and IR. Accordingly, the sensitivity can be extended into the IR and/or UV to spread the absorption spectra of the photoinitiators and avoid crosstalk.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(α-methylbenzyl) salicylate, oil soluble metals salts or phenol-formaldehyde novolak resins (e.g., see U.S. Pat. Nos. 3,672, 935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns.

A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 15% by weight, to prepare a coating composition. Preferably the binder remains stable despite changes in humidity. A preferred binder is NIPOL LX852, a modified acrylic ester type latex available from Nippon Zeon.

When the microcapsules and developer are mixed and used in one layer or coated wet in contiguous layers to form a self-contained system, the developer material is preferably one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall or both. The microcapsules may become completely disrupted with a complete breakdown or disintegration of the wall. The problem is believed to be caused by the presence of water-soluble acid salts in the developer solution. By modifying the acidic salts to make them water insoluble the developer material can be made compatible with the MF microcapsules. A preferred developer, which has good stability is Schenectady International phenolic resin HRJ-4250 solution.

Microencapsulation has been accomplished by a variety of known techniques including coacervation, interfacial polymerization, polymerization of one or more monomers in an oil, as well as various melting, dispersing and cooling methods. In one embodiment of the invention, the internal phase is encapsulated in a urea-formaldehyde wall-former and, more particularly, a urea-resorcinol-formaldehyde wall former in which resorcinol has been added to the wall former to enhance its oleophilicity. Other hydrophilic wall-forming materials which may also be useful in the present invention include gelatin (see U.S. Pat. No. 2,730,456 and 2,800,457 to Green et al) gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), melamine-formaldehyde resin and hydroxypropyl cellulose, urea-formaldehyde wall-formers and more particularly urea-resorcinol-formaldehyde wall formers (in which oleophilicity is enhanced by the addition of resorcinol) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Melamine-formaldehyde capsules are particularly useful. It is desirable in the present invention to provide a pre-wall in the preparation of the microcapsules. See U.S. Pat. No. 4,962,010 for a particularly preferred encapsulation using pectin and sulfonated polystyrene as system modifiers. The formation of pre-walls is known, however, the use of larger amounts of the polyisocyanate precursor is desired. A capsule size should be selected which minimizes light attenuation.

The mean size of the capsules used in the present invention may vary over a broad range but generally ranges from approximately 1 to 25 microns. As a general rule, image resolution improves as the capsule size decreases with the caveat that if the capsule size is too small, the capsules may sit within incongruities in the support and the support may screen the capsules from exposure. Very small capsules may also fail to rupture upon the application of pressure. In view of the foregoing, it has been found that a preferred mean capsule size range is approximately 1 to 15 microns and particularly approximately 1 to 10 microns.

In order to insure that the imaging system is effectively adhered to the support, a subbing layer may be provided between the support and the imaging layer. (The term "imaging layer" refers to the mixed layer of microcapsules and developer or to the combination of the microcapsule layer and the developer layer). In accordance with a preferred embodiment of the invention, the subbing layer is formed from a compound having chemical moieties such as hydroxy groups which will react with and bind to the microcapsules such as partially hydrolyzed polyesters and sulfonated polyesters of aromatic acids and aliphatic or cycloaliphatic alcohols and salts thereof such as the AQ polymers available from Eastman Chemical, e.g., AQ38 and AQ55. Useful polymers also include polyethylene oxide and, more particularly, AQUAZOL. The subbing layer may be applied in a coat weight of about 1 to 4 g/cm² (dry weight).

One technique which is useful to improve media stability resides in conditioning the developer and microcapsule layer at a relative humidity of about 45 to 80% and preferably, about 60%. Most preferably, the layer is conditioned at about 60% R. H., for about 2 to 12 hours or more at ambient temperatures. This has a beneficial effect on image retention and photospeed.

The protective coating typically is applied to the photosensitive layer in the form of an aqueous coating solution. The coating may be applied by any conventional method known in the art, including solvent casting, knife coating, extrusion coating, gravure, and reverse roll coating. The preferred viscosity and overall solid content of the coating solution depend on the coating method used. The coating should be essentially transparent and should exhibit minimal diffusion of light to minimize distortion of the image. The coating should maintain these properties over a broad temperature range without significant changes in transparency or light scattering. The coating is typically applied at a coating thickness from about 4 to 15 microns with the preferred coating thickness of about 9 microns.

The invention is illustrated in more detail by the following non-limiting examples.

Model Laboratory Capsule Preparation

1. Into a 200 ml stainless steel beaker, 110 g water and 4.6 g dry sodium salt of polyvinylbenzenesulfonic acid (VERSA) are weighed.
2. The beaker is clamped in place on a hot plate under an overhead mixer. A six-bladed, 45° pitch, turbine impeller is used on the mixer.
3. After thoroughly mixing, 4.0 g pectin (polygalacturonic acid methyl ester) is slowly sifted into the beaker. This mixture is stirred for 2 hours at room temperature (800–1200 rpm).
4. The pH is adjusted to 6.0 with 2% sodium hydroxide.
5. The mixer is turned up to 3000 rpm and the internal phase is added over a period of 10–15 seconds. Emulsification is continued for 10 minutes. Magenta and yellow precursor phases are emulsified at 25°–30° C., Cyan phase is emulsified at 45°–50° C. (oil), 25°–30° C. (water).
6. At the start of emulsification, the hot plate is turned up so heating continues during emulsification.
7. After 20 minutes, the mixing speed is reduced to 2000 rpm, and a solution of melamine-formaldehyde prepolymer is slowly added. This prepolymer is prepared by adding 6.5 g formaldehyde solution (37%) to a dispersion of 3.9 g melamine in 44 g water. After stirring at room temperature for 1 hour the pH is adjusted to 8.5 with 5% sodium carbonate and then heated to 62° C. until the solution becomes clear (30 minutes).
8. The pH is adjusted to 6.0, using 5% phosphoric acid. The beaker is then covered with foil and placed in a water bath to bring the temperature of the preparation to 75° C. When 75° C. is reached, the hot plate is adjusted to maintain this temperature for a two hour cure time during which the capsule walls are formed.
9. After curing, mixing speed is reduced to 1800 rpm, formaldehyde scavenger solution (7.7 g urea and 7.0 g water) is added and the solution cured another 40 minutes.

10. After 40 minutes hold time, turn down the mixer rpm to 1100 and adjust the pH to 9.5 using a 20% NaOH solution and then allow to stir at 500 rpm overnight at room temperature.

Three batches of microcapsules are prepared as above for use in a full color imaging sheet using the three internal phase compositions set forth below.

| Yellow Capsule Internal Phase (420 nm) | |
|---|---|
| TMPTA | 163.6 g |
| Photoinitiator | 0.80 g |
| 2-Mercaptobenzothiazole (MBT) | 0.55 g |
| 2,6-Diisopropyldimethylaniline (DIDMA) | 0.82 g |
| CP 269 (Yellow dye precursor from Hilton Davis) | 16.0 g |
| Desmodur N-100 (Bayer Biuret, Polyisocyanate Resins) | 13.09 g |

| Magenta Capsule Internal Phase (550 nm) | |
|---|---|
| TMPTA | 147.3 g |
| DPHPA | 16.3 g |
| Photoinitiator | 0.47 g |
| 2-Mercaptobenzothiazole (MBT) | 0.55 g |
| 2,6-Diisopropyldimethylaniline | 1.09 g |
| CP164 (Magenta dye precursor from Hilton-Davis) | 25.3 g |
| Desmodur N-100 (Bayer Biuret Polyisocyanate Resins) | 13.09 g |

| Cyan Capsule Internal Phase (650 nm) | |
|---|---|
| TMPTA | 114.50 g |
| DPHPA | 49.10 g |
| Photoinitiator | 0.85 g |
| 2-Mercaptobenzothiazole (MBT) | 0.55 g |
| 2,6-Diisopropyldimethylaniline | 1.09 g |
| CP 270 (Cyan precursor from Yamada Chemical Co. Jpn) | 16.0 g |
| Desmodur N-100 (Bayer Biuret, Polyisocyanate Resins) | 13.09 g |

Microcapsules prepared as above can be mixed at different percentage ratios to prepare a photosensitive Coating Composition. The ratios can be varied to obtain desired photographic characteristics.

A typical coating composition can be coated on PET support (Melinex) at different dry coat weights. A typical photosensitive microcapsules composition is:

| | | |
|---|---|---|
| Cyan Capsules | 38% | |
| Magenta Capsules | 32% | |
| Yellow Capsules | 30% | |

The following coating compositions were prepared and the imaging layer composition was coated on a white PET support. The protective coating was overcoated on the imaging layer. A control imaging media was prepared in the same manner except the imaging layer was formulated without the insolubilizer.

| 1) Imaging Layer Coating Composition | | | |
|---|---|---|---|
| Components | % solids | Wet wt (g) | Dry wt (g) |
| Photosensitive Microcapsules | 22.7 | 418.5 | 96 |
| LX852(Binder) | 45.0 | 44.8 | 20.16 |
| Sequarez 755 (Insolubilizer) | 50.0 | 20 | 10 |
| HRJ 4250 (Developer) | 33.0 | 439.4 | 145 |
| H$_2$O | | 77.3 | |
| Total | | 1000 g | 270.16 |

| 2) Protective Coating Composition | | | |
|---|---|---|---|
| Components | % solids | Wet wt (g) | Dry wt (g) |
| SA 532 (Binder) | 23.43 | 487.5 | 114.2 |
| ULS-1383MG (UV absorber) | 30.0 | 116 | 34.8 |
| Glyoxal (Cross-linker) | 40.0 | 28.6 | 11.44 |
| Snowtex C (Pigment) | 20.0 | 28.6 | 5.72 |
| PELEX-OTP (Surfactant) | 5.0 | 28.6 | 1.43 |
| F140NK (Surfactant) | 1.0 | 40 | 0.40 |
| H$_2$O | | 270.7 | |
| Total | | 1030 | 168 |

The imaging media of the present invention (I) and the control imaging media (II) were image-wise exposed and developed using pressure and heat. Humidity stability was determined by measuring Dmax and D50 before and after storing under high humidity conditions.

Humidity stability under test conditions of 21° C./80% RH and 21° C./45% RH Results

| | Dmax | | | D50 | | |
|---|---|---|---|---|---|---|
| Sample | C | M | Y | C | M | Y |
| I (Invention) Initial | 1.75 | 1.72 | 1.61 | 1.15 | 1.16 | 1.60 |
| I (Invention) after 21 C./80% RH 2 wks | 1.70 | 1.68 | 1.59 | 1.17 | 1.16 | 1.62 |
| II (Control) Initial | 1.79 | 1.78 | 1.60 | 1.17 | 1.20 | 1.63 |
| II (Control) after 21 C./80% RH 2 wks | 1.48 | 1.45 | 1.25 | 1.40 | 1.43 | 1.85 |

D50 = relative value
Invented media (I) exhibited good humidity stability maintaining Dmax, D50 even after 21 C./80% RH storage, compared with Control Media (II).

Having described the invention in detail and by reference to preferred embodiments thereof, it will be apparent that modifications and variations are possible without departing from the scope of the invention as defined in the following claims.

What is claimed is:

1. A self-contained photosensitive material comprising:
    a support;
    an imaging layer on the support, the imaging layer comprising a developer material and a plurality of photosensitive microcapsules encapsulating a photosensitive composition and a color precursor; and
    a protective coating on the imaging layer, the protective coating comprising a cured film of a water-soluble or water-dispersible resin and a crosslinking agent, wherein upon image-wise exposing the imaging layer to actinic radiation and rupturing the microcapsules, the color precursor is released from the microcapsules and reacts with the developer material to form a color image.

2. The photosensitive material of claim 1 wherein said crosslinking agent is a polyvalent aldehyde.

3. The photosensitive material of claim 2 wherein said polyvalent aldehyde is selected from the group consisting of glyoxal, glutaraldehyde and derivatives thereof.

4. The photosensitive material of claim 3 wherein said crosslinking agent is glyoxal.

5. The photosensitive material of claim 1 wherein said photosensitive material further includes a subbing layer between said support and said imaging layer.

6. The photosensitive material of claim 1 wherein said photosensitive material further includes an insolubilizer.

7. The photosensitive material of claim 6 wherein said insolubilizer is a compound of the general formula (I), (II) or (III):

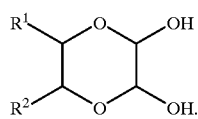
(I)

wherein $R^1$ and $R^2$ are the same or different and represent H, OH, alkyl (C1–C10), hydroxylalkyl, polyhydroxy substituted alkyl, alkyl carbonyloxy alkyl, alkenyl (C2–C10) carbonyloxy alkyl, or carbonyloxy alkyl having carboxyl, carboxyl salt or a carboxy ester group as a terminal group;

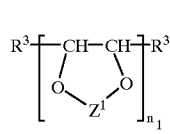
(II)

wherein $R^3$ is H, OH, alkyl (C1–C10), hydroxyalkyl, polyhydroxy substituted alkyl, alkyl carbonyloxy alkyl or alkenyl (C2–C10) carbonyloxy alkyl, $n_1=2-4$ and $Z^1$ is

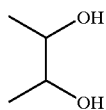

if a dioxan is formed and if a dioxan is not formed $Z^1$ represents H atoms which form a diol; or

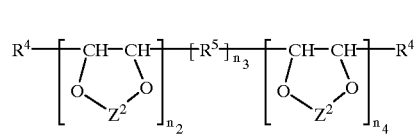
(III)

wherein $R^4$ is H, OH, alkyl (C1–C10), hydroxyalkyl, polyhydroxy substituted alkyl, alkyl carbonyloxyalkyl or alkenyl (C2–C10) carbonyloxy alkyl; $R^5$ is —$CH_2$— or —CH(OH)—; $n_2$, $n_3$, $n_4$ are each 1 or 2 and $Z^2$ is the same as $Z^1$ above.

8. The photosensitive material of claim 7 wherein said insolubilizer is a compound selected from the group consisting of:

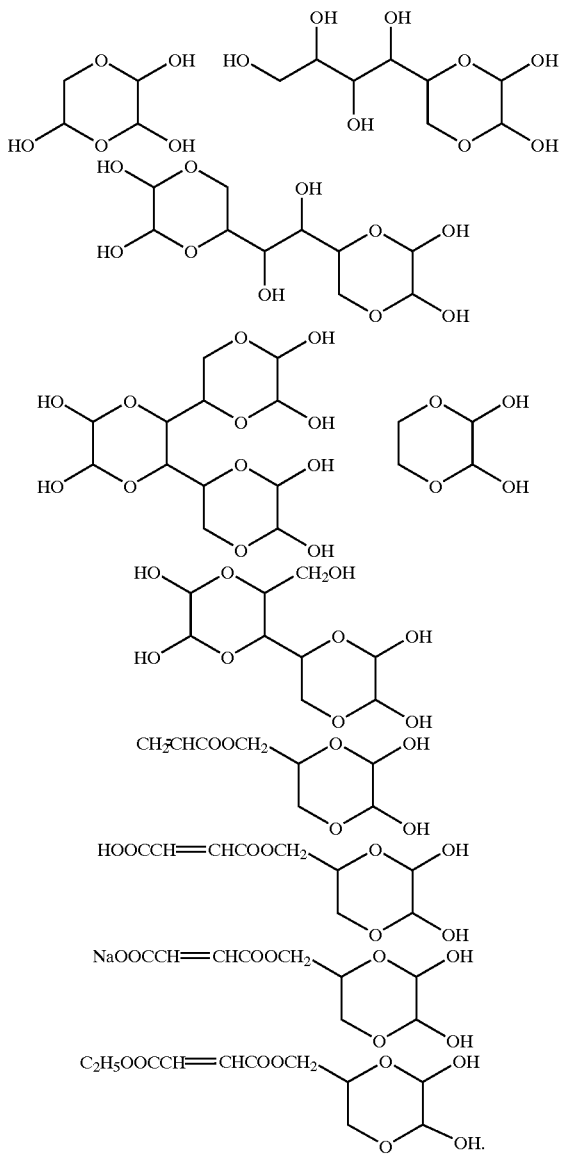

9. The photosensitive material of claim 8 wherein said insolubilizer is:

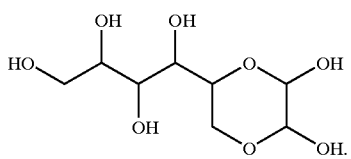

10. The photosensitive material of claim 6 wherein said insolubilizer is present in said imaging layer.

11. The photosensitive material of claim 6 wherein said insolubilizer is present in said protective coating.

12. The photosensitive material of claim 6 wherein said insolubilizer is present in an amount of about 0.5 to 10% based on the total dry weight of the protective coating and the imaging layer.

13. The photosensitive material of claim 1 wherein said support is an opaque polyethylene terephthalate film containing a white pigment.

14. The photosensitive material of claim 1 wherein said imaging layer further comprises a binder.

15. The photosensitive material of claim 14 wherein said binder is a modified acrylic ester latex.

16. The photosensitive material of claim 1 wherein said protective coating comprises from about 60 to 80% water-soluble or water-dispersible resin and from about 4 to 10% crosslinking agent by dry weight.

17. The photosensitive material of claim 1 wherein said protective coating further comprises a UV absorber.

18. The photosensitive material of claim 1 wherein said protective coating has a thickness of from about 4 to 15 microns.

19. The photosensitive material of claim 1 wherein said imaging layer comprises a layer of microcapsules and a separate layer of a developer material.

20. A photosensitive material comprising a support having a layer of microcapsules thereon, said photosensitive microcapsules including an internal phase containing a photosensitive composition and a color precursor wherein, upon image-wise exposing said photosensitive material to actinic radiation and rupturing said microcapsules in the presence of a developer material, said color precursor image-wise reacts with said developer to form a color image, the improvement wherein said photosensitive material further comprises a protective coating on said microcapsule layer, said protective coating comprising from about 50 to 90% of a water-soluble or water-dispersible resin and from about 2 to 20% of a crosslinking agent.

21. The photosensitive material of claim 20 further comprising an insolubilizer.

22. A method for producing a self-contained photosensitive material which comprises:

(a) coating a photosensitive imaging composition on a support, said photosensitive imaging composition comprising a developer material and a plurality of photosensitive microcapsules encapsulating a photosensitive composition and a color precursor to form an imaging layer;

(b) overcoating said imaging layer with a protective coating composition, said protective coating composition comprising a water-soluble or water-dispersible resin and a crosslinking agent; and (c) drying and/or curing said protective coating.

23. The method of claim 22 wherein the water-soluble or water-dispersible resin is an acrylic latex.

24. The method of claim 22 wherein said water-soluble resin is an acrylic latex and said crosslinking agent is glyoxal.

25. The method of claim 22 wherein said protective coating composition further comprises an insolubilizer.

26. The method of claim 22 wherein said imaging composition further comprises an insolubilizer.

* * * * *